United States Patent [19]
Tempel

[11] Patent Number: 5,828,092
[45] Date of Patent: Oct. 27, 1998

[54] SEMICONDUCTOR MEMORY DEVICE AND METHOD FOR ITS PRODUCTION

[75] Inventor: Georg Tempel, München, Germany

[73] Assignee: Siemens Aktiengesellschaft, Munich, Germany

[21] Appl. No.: 639,123

[22] Filed: Apr. 24, 1996

[30] Foreign Application Priority Data

Apr. 24, 1995 [DE] Germany ................. 95 106 098.7

[51] Int. Cl.$^6$ ........................... H01L 29/76; H01L 29/94; H01L 31/062; H01L 31/113
[52] U.S. Cl. ............................................. 257/295
[58] Field of Search ............................................. 257/295

[56] References Cited

U.S. PATENT DOCUMENTS

| | | |
|---|---|---|
| 5,101,251 | 3/1992 | Wakamiya et al. . |
| 5,416,735 | 5/1995 | Onishi et al. ............................ 257/295 |

FOREIGN PATENT DOCUMENTS

| | | |
|---|---|---|
| 0 503 078 A1 | 9/1992 | European Pat. Off. . |
| 0 557 590 A1 | 9/1993 | European Pat. Off. . |
| 39 22 456 A1 | 11/1990 | Germany . |
| 41 07 165 A1 | 10/1991 | Germany . |

OTHER PUBLICATIONS

"Ferroelectrics and high Permittivity Dielectrics for Memory Applications" (Larsen et al.), dated Aug. 1993, Microelectronic Engineering, Nos. 1/4, Amsterdam, pp. 53–60.

"Integration of Ferroelectric Capacitor Technology with CMOS" (Moazzami et al.), 1994 Symposium on VLSI Technology Digest of Technical Papers, pp. 55–56.

"A 256kb Nonvolatile Ferroelectric Memory at 3V and 100ns" (Tatsumi et al.), 1994 ISSCC, Session 16, Technology Directions: Memory, Packaging, Paper FA 16.2, pp. 206–209 and 315–316.

"Recessed Memory Array Technology for a Double Cylindrical Stacked Capacitor Cell of 256M DRAM" (Sagara et al.), dated Nov. 1992, IEICE Transactions on Electronics, vol. E75–C, No. 11.

*Primary Examiner*—Stephen Meier
*Attorney, Agent, or Firm*—Herbert L. Lerner; Laurence A. Greenberg

[57] ABSTRACT

A semiconductor memory device includes a semiconductor substrate having a surface defining a plane extending substantially parallel thereto. A multiplicity of memory cells disposed on the substrate each have a selection transistor disposed in the plane. The transistor has a gate terminal and first and second electrode terminals. Each of the memory cells has a storage capacitor associated with and triggerable by the transistor. The capacitor has a ferroelectric dielectric and first and second capacitor electrodes. The capacitor has a configuration projecting upward from the plane and is disposed inside a trench extending as far as the second electrode terminal of the transistor. A word line is connected to the gate terminal of the transistor, a bit line is connected to the first electrode terminal of the transistor, and a common conductor layer of electrically conductive material is connected to the first capacitor electrode of the capacitor. A method for producing the device includes producing the capacitor after production of the transistor and metallizing layers associated with the transistor for connection of the word and bit lines, in a configuration projecting upward from the plane, and placing the capacitor inside a trench extending as far as the second electrode terminal of the transistor.

10 Claims, 2 Drawing Sheets

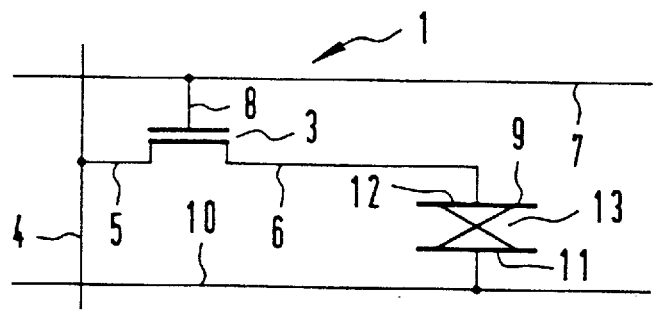
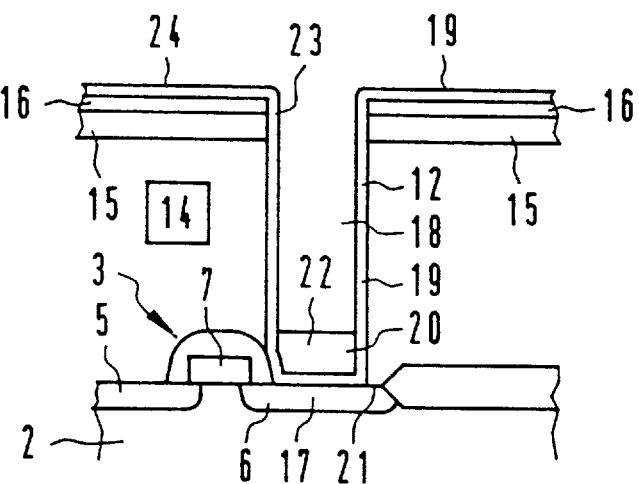
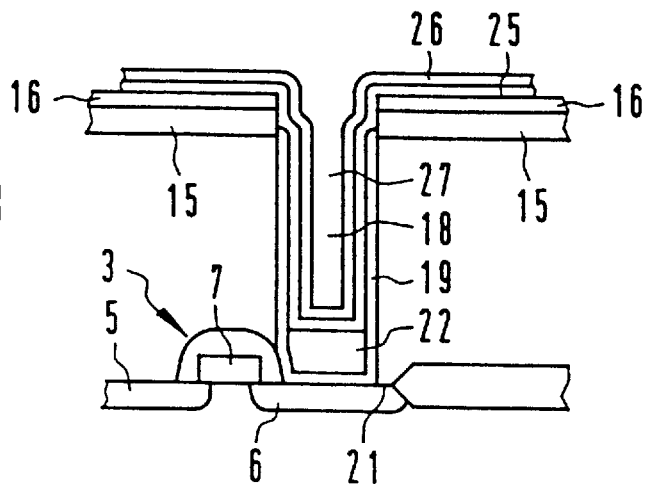

SEMICONDUCTOR MEMORY DEVICE AND METHOD FOR ITS PRODUCTION

BACKGROUND OF THE INVENTION:

FIELD OF THE INVENTION

The invention relates to a semiconductor memory device having a multiplicity of memory cells disposed on a semiconductor substrate, each of the memory cells has a selection transistor disposed in a plane extending substantially parallel to the surface of the semiconductor substrate, each selection transistor has a gate terminal, a first electrode terminal and a second electrode terminal, each of the memory cells has a storage capacitor associated with and triggerable by the selection transistor, the storage capacitor has a ferroelectric dielectric, a first capacitor electrode and a second capacitor electrode, each gate terminal of the selection transistor is connected to a word line of the semiconductor memory device, each first electrode terminal of the selection transistor is connected to a bit line, and each first capacitor electrode of the storage capacitor is connected to a common conductor layer of electrically conductive material. The invention also relates to a method for producing such a semiconductor memory device.

Such a semiconductor memory device having a storage capacitor with a ferroelectric dielectric (a so-called FRAM) is known, for instance, from The 1994 Symposium on VLSI Technology Digest of Technical Papers, pp. 55 ff. by R. Moazzami et al, and from The 1994 IEEE International Solid-State Circuits Conference, pp. 268 ff. by Tatsumi Sumi et al. In that semiconductor memory device the storage capacitors with the ferroelectric dielectric are constructed in planar fashion and because of the wiring the also have cell surface areas of considerable size per bit, which is considered to be disadvantageous in view of the desired large scale of integration. Despite the problems that so far still exist, a great future is predicted for ferroelectric memories or FRAMs. They could entirely replace present semiconductor memories (DRAMs, SRAMs, EEPROMs, flash EEPROMs). The advantage of FRAMs resides above all in the brief programming time (>20 ns), a low programming voltage (from about 3 V of supply voltage to the ICs), low energy consumption in programming (no charge pump required), and frequent programmability ($10^{12}$ demonstrated and $10^{15}$ expected, compared with 10 in EEPROMs). Examples of materials for the ferroelectric layer that appear especially promising at present are lead zirconium titanate, strontium tantalate, or compounds thereof. One of the problems that are still an obstacle to rapid introduction of FRAM technology is an as-yet unsolved compatibility with a production process for integrated circuits. In particular, a necessity for platinum electrodes in the ferroelectric storage capacitor and a spin-on coating, which heretofore has been conventional, for applying a ferroelectric gel, which is associated with a relatively great layer thickness and thus a capacitance that requires a large surface area, heretofore prevented profitable use in semiconductor technology, so that heretofore no process for producing FRAMs that is suitable for mass production was known. In this respect it must also be remembered that depositing the relatively complex materials for the ferroelectric dielectric, a problem of a satisfactory source which is suitable for the process that is associated therewith, and moreover a lack of quality of the layers because of fissuring, leakage currents, temperature influences and electrode adhesion, all contribute to the problems of process integration. In particular, the ferroelectric materials known heretofore react especially sensitively to hydrogen. However, hydrogen can hardly be suppressed in the known methods for producing a semiconductor memory device, and in such methods occurs especially in plasma deposition processes and plasma etching processes.

In addition to those FRAM cells, large-scale integration DRAM semiconductor memories with conventional materials for the storage capacitor dielectric are known. In order to make DRAM semiconductor memories with a memory capacity of up to about 256 MB at present, dielectrics with a high dielectric constant are used so that as the cell area becomes smaller an adequate capacitance, typically of more than about 20 fF per cell, is still attainable. Heretofore, for those purposes, an ONO layer has been used in most cases, but its technological limits have become apparent in the meantime, since upon a further reduction in thickness the leakage current rises above the predetermined limit value, and adequate capacitances (surface areas) can be obtained only through the use of such complicated structures as trench or stacked capacitors. For those reasons, new materials that have a high enough dielectric constant are therefore increasingly being used for the dielectric of the storage capacitor. However, the alternative dielectric materials known thus far are extremely sensitive to the usual strains arising in the method used heretofore to produce a semiconductor memory device, namely stability to high process temperatures, undesired chemical reactions, and the like.

SUMMARY OF THE INVENTION:

It is accordingly an object of the invention to provide a semiconductor memory device and a method for its production, which overcome the hereinafore-mentioned disadvantages of the heretofore-known devices and methods of this general type, in which the device has a ferroelectric storage capacitor that has a scale of integration which is virtually comparable to present DRAM circuits with suitably high reliability and quality, and in which the method produces a semiconductor memory device that can be integrated at comparatively little expense into existing process sequences and is suitable for mass production, or in other words which enables a high yield of finished semiconductor memory devices having ferroelectric storage capacitors, with the least possible number of premature failures.

With the foregoing and other objects in view there is provided, in accordance with the invention, a semiconductor memory device, comprising a semiconductor substrate having a surface defining a plane extending substantially parallel to the surface; a multiplicity of memory cells disposed on the semiconductor substrate; each of the memory cells having a selection transistor disposed in the plane, the selection transistor having a gate terminal, a first electrode terminal and a second electrode terminal; each of the memory cells having a storage capacitor being associated with and triggerable by the selection transistor, the storage capacitor having a ferroelectric dielectric, a first capacitor electrode and a second capacitor electrode, the storage capacitor having a configuration projecting upward from the plane, and the storage capacitor being disposed inside a trench extending as far as the second electrode terminal of the selection transistor; a word line to which the gate terminal of the selection transistor is connected; a bit line to which the first electrode terminal of the selection transistor is connected; and a common conductor layer of electrically conductive material to which the first capacitor electrode of the storage capacitor is connected.

This embodiment of the storage capacitor with the ferroelectric dielectric in an upward-projecting configuration makes it possible, with the smallest possible surface area of the FRAM cell, to nevertheless achieve an adequate capacitance of the storage capacitor. The embodiment according to the invention with a configuration of the ferroelectric storage capacitor that projects upward from the plane of the substrate surface permits the production of the ferroelectric, which is considered to be critical in view of the desired large scale of integration, after complete production of the components of the memory cell that are less critical in this respect, that is selection transistors with complete metallizing including associated electrodes, preferably in such a way that the ferroelectric gel to be applied through the use of spin technology is applied inside a thin hollow layer formed between the two capacitor electrodes. The hollow layer likewise has a configuration that projects upward from the plane of the substrate surface. In accordance with another feature of the invention, the configuration of the storage capacitor projecting upward from the plane of the substrate surface is substantially cylinder-symmetrical, with a center axis of the cylinder extending approximately perpendicular to the plane of the substrate surface.

In accordance with a further feature of the invention, the second capacitor electrode of the storage capacitor constructed inside the trench is cup-shaped and has a form corresponding to the inner contour of the trench, with an approximately U-shaped or V-shaped cross section crosswise to the longitudinal extension of the storage capacitor.

In accordance with an added feature of the invention, the bottom region of the second capacitor electrode of approximately U-shaped or V-shaped cross section is coupled electrically with the second electrode terminal of the selection transistor.

In accordance with an additional feature of the invention, the first capacitor electrode of the storage capacitor has an electrode segment being formed inside the trench and extending coaxially with the lengthwise extension of the trench and opposite the second capacitor electrode, and the ferroelectric dielectric is disposed at least between the electrode segment of the first capacitor electrode and the second capacitor electrode.

In accordance with yet another feature of the invention, the first capacitor electrode of the storage capacitor is constructed in cup-like fashion inside the second capacitor electrode.

In accordance with yet a further feature of the invention, an intermediate layer of an electrically insulating material is provided between the bottom region of the second capacitor electrode and a bottom portion of the first capacitor electrode formed in cup-shaped fashion inside the second capacitor electrode.

In accordance with yet an added feature of the invention, the intermediate layer, produced from an electrically insulating material, has a buffer layer for wet chemical etching.

In accordance with yet an additional feature of the invention, there is provided at least one metallizing layer representing the bit lines, the trench being formed entirely inside the at least one metallizing layer and having an electrically insulating coating for electrical insulation from the at least one metallizing layer.

With the objects of the invention view there is also provided, in accordance with the invention, a method for producing a semiconductor memory device, which comprises placing a multiplicity of memory cells on a semiconductor substrate having a surface defining a plane extending substantially parallel to the surface; providing each of the memory cells with a selection transistor being disposed in the plane and having a gate terminal, a first electrode terminal and a second electrode terminal; providing each of the memory cells with a storage capacitor being associated with and triggerable by the selection transistor and having a ferroelectric dielectric, a first capacitor electrode and a second capacitor electrode; connecting the gate terminal of the selection transistor to a word line; connecting the first electrode terminal of the selection transistor to a bit line; connecting the first capacitor electrode of the storage capacitor to a common conductor layer of electrically conductive material; producing the storage capacitor after production of the selection transistor and metallizing layers associated with the selection transistor for connection of the word and bit lines, in a configuration projecting upward from the plane; and placing the storage capacitor inside a trench extending as far as the second electrode terminal of the selection transistor.

The concept of the method of the invention is based in this case initially on the recognition of disclosing a semiconductor memory device or a process sequence for producing the semiconductor memory device, in which the ferroelectric materials can be successfully tied into the process sequence for producing the semiconductor memory device, specifically by providing that not until after the production of the completely constructed selection transistors, together with complete metallizing and including all of the electrodes associated with the selection transistor, the dielectric material is applied and, to perform the necessary crystallization, is subjected to a heat treatment. The conductor tracks applied prior to this heat treatment may be manufactured from a temperature-stable material, such as tungsten or copper.

In accordance with another mode of the invention, the method for producing a semiconductor memory device with a storage capacitor having a ferroelectric dielectric includes the following steps, after production of the selection transistor:

etching of a trench extending at least as far as the second electrode terminal of the selection transistor;

deposition conformally with the inner contour of the trench of an electrically conductive layer for the second capacitor electrode inside the trench;

conformal deposition of an auxiliary layer, acting as a space-holder for the ferroelectric dielectric, inside the trench onto the electrically conductive layer for the second capacitor electrode;

conformal deposition of an electrically conductive layer for the first capacitor electrode inside the trench onto the auxiliary layer;

removal of the auxiliary layer and resultant exposure of a hollow layer in at least a partial region between the two electrically conductive layers for the first and second capacitor electrodes; and deposition of the ferroelectric dielectric into the exposed hollow layer between the two electrically conductive layers for the first and second capacitor electrodes.

In accordance with a further mode of the invention, the step of depositing the dielectric layer having the ferroelectric dielectric is carried out through the use of spin-on coating.

In accordance with an added mode of the invention, the method includes the following steps: back-etching of the electrically conductive layer being deposited conformally with the inner contour of the trench, for the second capacitor electrode at least far enough to ensure that the portion of the electrically conductive layer, deposited in planar fashion outside the trench, for the second capacitor electrode, is removed. In this way, the danger of an electrical short circuit of the two capacitor electrodes is reduced.

In accordance with an additional mode of the invention, the method includes a full-surface deposition of an electrically conductive layer for the common conductor layer onto the first capacitor electrode, and a full-surface deposition of a passivation layer onto the common conductor layer.

In accordance with yet another mode of the invention, before the step of conformal deposition of the auxiliary layer acting as a space-holder for the ferromagnetic dielectric, the trench is at least partially filled with an intermediate layer of an electrically insulating material.

In accordance with a concomitant mode of the invention, the intermediate layer made from an electrically insulating material has a buffer layer for wet chemical etching, and the step of at least partial filling the trench with the intermediate layer is followed by back-etching of that layer.

In an especially preferred feature of the semiconductor memory device or mode of the method of the invention, the ferroelectric dielectric is a ferroelectric gel, which in particular has a lead zirconium titanate (PZT) and/or a strontium tantalate compound (Y-1).

The material forming the layer for the first and/or second capacitor electrode also preferably has titanium and/or platinum, wherein the layer for the first and/or the second capacitor electrode may also be constructed as a multiple layer, preferably with a layer sequence of titanium/titanium nitride/platinum.

The intermediate layer provided between the bottom region of the second capacitor electrode and the bottom portion of the first capacitor electrode constructed in cup-shaped fashion inside the second capacitor electrode may advantageously be made from a flow glass material. The auxiliary layer acting as a space-holder for the ferromagnetic dielectric is a CVD oxide, for instance. Moreover, the filler material for filling the void remaining in the trench is a high-temperature-stable material, which in particular has tungsten or a tungsten compound.

Other features which are considered as characteristic for the invention are set forth in the appended claims.

Although the invention is illustrated and described herein as embodied in a semiconductor memory device and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS:

FIG. 1 is a basic schematic circuit diagram of a semiconductor device according to the invention having a FRAM cell; and FIGS. 2–6 are fragmentary, diagrammatic, sectional views showing successive method steps in the production of the semiconductor memory device of the invention.

Figure 4:
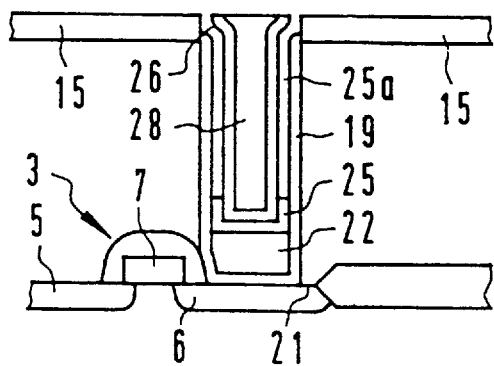

DESCRIPTION OF THE PREFERRED EMBODIMENTS:

Referring now to the figures of the drawings in detail and first, particularly, to FIG. 1 thereof, there is seen a substitute circuit diagram of a semiconductor memory device of the invention having a FRAM cell 1 with a selection transistor 3 that is preferably of the MOS type (formed on a semiconductor substrate 2 shown in FIG. 2). The selection transistor 3 has a first electrode terminal 5 (source) connected to a bit line 4 made of tungsten or polycide, a second electrode terminal 6 (drain), and a gate terminal 8 connected to a word line 7 made of $n^+$polysilicon or polycide. The FRAM cell 1 also has a storage capacitor 9 with a first capacitor electrode 11 connected to a common conductor layer 10 (field plate), a second capacitor electrode 12 connected to the second electrode terminal 6 of the selection transistor 3, and a ferroelectric dielectric 13 inserted between the first and second capacitor electrodes.

The point of departure of the exemplary embodiment of the method of the invention for producing the semiconductor memory device, which is shown in FIGS. 2–6, is the configuration shown in FIG. 2 that is made by method steps which are known per se up to a complete production of the selection transistors, word lines, bit lines, peripheral transistors, metallizing and passivation. Besides the components already mentioned, reference numeral 14 designates merely diagrammatically shown metallizing layers for the connection of the word and bit lines.

An insulating nitride layer 15 produced by conventional DRAM process sequences is first applied over the entire surface as a cover layer on the configuration of FIG. 2. The insulating nitride layer 15 has a thickness of preferably approximately 100 nm to 500 nm and it is structured through the use of a photolithography step that is known per se, or with the use of an additional masking layer 16, which by way of example is made of polysilicon and serves as a relatively hard masking layer for an ensuing etching. Next, a trench 18 that is constructed in such a way as to protrude relative to a plane 21 of the substrate surface is etched through the use of a contact hole etching step, through all of the oxide layers down to an $n^+$doped diffusion zone 17 of the second electrode terminal 6 of the selection transistor 3. The etching can be carried out at least partially in overlapping fashion. Next, in order to produce the connection to the diffusion zone 17 of the selection transistor 3, a conductive layer 19 for the second capacitor electrode 12 is deposited conformally. The conductive layer 19 may optionally be constructed as a multiple layer with the order of layers being Ti/TiN/Pt (with Ti as the layer oriented toward the $n^+$silicon) and may optionally have an additional non-illustrated buffer layer. A remaining void in the trench 18 is filled with a suitable flow glass material 20, which is then back-etched, preferably wet chemically, so as to obtain an adequate buffer layer 22 on the bottom of the trench 18 for the ensuing etching. In order to prevent an electrical short circuit to the later-completed common conductor layer 10 for the field plate, the conductive layer 19 is back-etched at least far enough to ensure that a portion 23 of an upper peripheral region of the electrically conductive layer 19 inside the trench 18 and a portion 24 of the electrically conductive layer 19 deposited in planar fashion outside the trench 18, are removed.

As is shown in FIG. 3, an auxiliary layer 25 of a CVD oxide, acting as a space-holder for the ferromagnetic dielectric, is deposited conformally onto the electrically conductive layer 19 inside the trench 18, on the thus-created configuration. Next, an electrically conductive layer 26 for the first capacitor electrode 11 is deposited conformally onto the auxiliary layer 25 inside the trench 18. The electrically conductive layer 26 may preferably be made from platinum or some other suitable metal, and moreover may also be constructed as a multiple layer, preferably with layers in the order of Pt/TiN/Ti. A void 27 remaining in the trench 18 is filled in accordance with FIG. 4 with a high-temperature-proof filler material 28, which preferably has tungsten. After filling with tungsten, the filler material 28 and the optionally present masking layer 16 are back-etched or back-ground.

Once a heat treatment is carried out through the use of a forming gas tempering, and resultant curing of all of the prior process steps, the material of the auxiliary layer 25, acting as a space-holder for the ferromagnetic dielectric, is etched free by wet chemical provisions, as shown in Fig. 4. Specifically, the wet chemical etching is carried out at least far enough to ensure that between the two layers 19 and 26 for the capacitor electrodes 11 and 12, a hollow layer 25a is formed that is oriented at least approximately vertically relative to the plane 21 of the substrate surface. The material for the ferromagnetic dielectric 13 is then introduced or deposited into the hollow layer through the use of spin-on coating (or spin-on technology) and subjected to a heat treatment step for the sake of crystal formation. A bottom which is left behind in the wet chemical etching of the CVD oxide 25 serves the purpose of mechanically bracing the electrically conductive layer 26 of the first capacitor electrode, which is disposed coaxially inside the trench.

Figure 5:
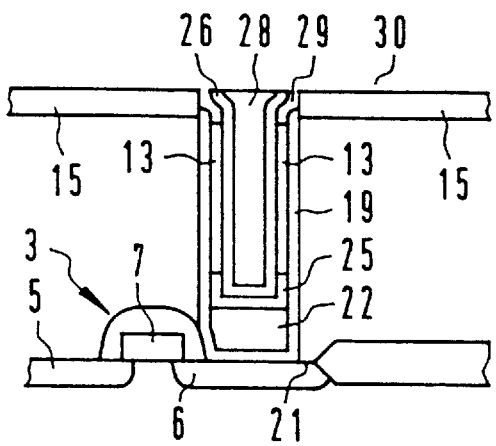

Next, as is shown in FIG. 5, the dielectric material 13 can be back-etched at least far enough to ensure that a portion 29 of an upper peripheral region of the ferromagnetic dielectric inside the trench 18 and a portion 30 of the ferromagnetic dielectric 13 deposited in planar fashion outside the trench, are removed. In this way, the configuration shown in FIG. 5 is obtained.

Figure 6:
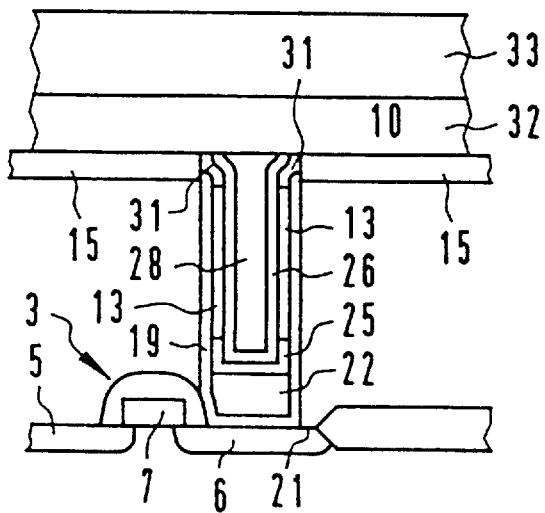

Next, as is shown in FIG. 6, an insulating layer 31 is deposited, which serves the purpose of electrical insulation of the adjoining field plate 10. In order to form a planar surface, the insulating layer 31 that has been deposited is back-etched or back-ground. After this step, an electrically conductive layer 32 acting as the field plate 10 for the common connection of the first capacitor electrodes 11, is deposited and optionally structured. This is followed for the sake of completeness by a step of depositing a passivation layer 33.

I claim:

1. A semiconductor memory device, comprising:

a semiconductor substrate having a surface defining a plane extending substantially parallel to said surface;

a multiplicity of memory cells disposed on said semiconductor substrate;

each of said memory cells having a selection transistor disposed in said plane, said selection transistor having a gate terminal, a first electrode terminal and a second electrode terminal;

each of said memory cells having a storage capacitor being associated with the triggerable by said selection transistor, said storage capacitor having a ferroelectric dielectric, a first capacitor electrode and a second capacitor electrode, said storage capacitor having a configuration projecting upward from said plane, and said storage capacitor being disposed inside a trench extending as far as said second electrode terminal of said selection transistor;

a word line to which said gate terminal of said selection transistor is connected;

a bit line to which said first electrode terminal of said selection transistor is connected; and a common conductor layer of electrically conductive material to which said first capacitor electrode of said storage capacitor is connected.

2. The semiconductor memory device according to claim 1, wherein said configuration of said storage capacitor projecting upward from said plane is substantially cylinder-symmetrical and has a center cylinder axis extending approximately perpendicular to said plane.

3. The semiconductor memory device according to claim 1, wherein said second capacitor electrode of said storage capacitor inside said trench has a cup-shaped form corresponding to an inner contour of said trench, with an approximately U-shaped cross section crosswise to a longitudinal extension of said storage capacitor.

4. The semiconductor memory device according to claim 3, wherein said second capacitor electrode of approximately U-shaped cross section has a bottom region being coupled electrically with said second electrode terminal of said selection transistor.

5. The semiconductor memory device according to claim 1, wherein said second capacitor electrode of said storage capacitor inside said trench has a cup-shaped form corresponding to an inner contour of said trench, with an approximately V-shaped cross section crosswise to a longitudinal extension of said storage capacitor.

6. The semiconductor memory device according to claim 3, wherein said second capacitor electrode of approximately V-shaped cross section has a bottom region being coupled electrically with said second electrode terminal of said selection transistor.

7. The semiconductor memory device according to claim 1, wherein said first capacitor electrode of said storage capacitor has an electrode segment being formed inside said trench and extending coaxially with a lengthwise extension of said trench and opposite said second capacitor electrode, and said ferroelectric dielectric is disposed at least between said electrode segment of said first capacitor electrode and said second capacitor electrode.

8. The semiconductor memory device according to claim 1, wherein said first capacitor electrode of said storage capacitor is cup-like inside said second capacitor electrode.

9. The semiconductor memory device according to claim 8, wherein said second capacitor electrode has a bottom region, said first capacitor electrode has a bottom portion, and including a layer of electrically insulating material disposed between said bottom region of said second capacitor electrode and said bottom portion of said first capacitor electrode.

10. The semiconductor memory device according to claim 1, including at least one metallizing layer representing said bit lines, said trench being formed entirely inside said at least one metallizing layer and having an electrically insulating coating for electrical insulation from said at least one metallizing layer.

* * * * *